United States Patent [19]

Wessely

[11] Patent Number: 5,153,814
[45] Date of Patent: Oct. 6, 1992

[54] MOUNTING SYSTEM FOR ELECTRICAL FUNCTION UNITS, PARTICULARLY FOR DATA TECHNOLOGY

[75] Inventor: Hermann Wessely, Munich, Fed. Rep. of Germany

[73] Assignee: Siemens Nixdorf Informationssysteme AG, Fed. Rep. of Germany

[21] Appl. No.: 732,482

[22] Filed: Jul. 18, 1991

[30] Foreign Application Priority Data

Aug. 3, 1990 [DE] Fed. Rep. of Germany ....... 4024737

[51] Int. Cl.⁵ .............................................. H05K 7/20
[52] U.S. Cl. .................................. 361/382; 165/80.4; 361/385; 439/66
[58] Field of Search ...................... 439/66, 74, 485, 75, 439/487; 357/81, 82; 165/80.3, 80.4, 104, 33; 174/252, 262; 361/382, 385–389, 396, 400, 401, 403, 410, 412, 413, 414

[56] References Cited

U.S. PATENT DOCUMENTS

| | | | |
|---|---|---|---|
| 4,019,098 | 4/1977 | McCready | 361/385 |
| 4,037,270 | 7/1977 | Ahmann | 361/385 |
| 4,597,617 | 7/1986 | Enochs | 361/398 |
| 4,734,315 | 3/1988 | Spence-Bate | 428/209 |
| 4,953,060 | 8/1990 | Lauffer | 361/388 |
| 5,014,117 | 5/1991 | Horvath | 361/386 |
| 5,016,138 | 5/1991 | Woodman | 361/381 |
| 5,060,113 | 10/1991 | Jacobs | 361/386 |

FOREIGN PATENT DOCUMENTS 0113794 7/1984 European Pat. Off. .
0428859 5/1991 Fed. Rep. of Germany .

OTHER PUBLICATIONS

"Computer Packaging", Siemens Forschunge -und Entwicklungsberichte, vol. 17, 1988, No. 5, p. 237.

Primary Examiner—Gerald P. Tolin
Attorney, Agent, or Firm—Hill, Van Santen, Steadman & Simpson

[57] ABSTRACT

A mounting system for electrical function units, particularly for a data technology system is composed of an alternating sequence of cooling plates provided with cooling channels for a coolant and with through-contactings and of printed circuit boards constructed in microwiring technology. These printed circuit boards have contact areas on both of their surfaces for contacting the terminal contact pads of integrated components that in turn have their side not provided with terminal contact pads pressing against the cooling plates. External operating and signal voltages are supplied to the function units. Such a structure enables a high packing density of the components. In the mounting system the packing density of such components is further increased by connecting the terminal contact pads of the integrated components to the contact areas of the printed circuit boards directly via contact mats.

17 Claims, 2 Drawing Sheets

MOUNTING SYSTEM FOR ELECTRICAL FUNCTION UNITS, PARTICULARLY FOR DATA TECHNOLOGY

BACKGROUND OF THE INVENTION

The present invention is directed to a mounting system for electrical function units, particularly in the field of data technology, composed of an alternating sequence of cooling plates, provided with cooling channels for a coolant and with through-connections, and printed circuit boards constructed in microwiring technology. The printed circuit boards have two surfaces that comprise contact areas (contact pads) for contacting the terminal contact areas (terminal pads) of integrated components that in turn have a side not provided with terminal pads pressing against the cooling plates. The external operating and signal voltages are supplied to the function units via plugs.

Due to the increasing number of switch functions per cubic unit in, for example, integrated circuits, greater demands are being made of the structural part of electronic equipment in many fields of electronic engineering, for example, in data technology. The feed of numerous lines on a smaller space and the elimination of the heat that occurs are critical factors that must be taken into consideration.

A structure that addresses the high demands in the sense set forth above is disclosed by European Patent 113,794. The printed circuit boards provided with components, particularly multilayer printed circuit boards having chips, are arranged side-by-side in one plane in a grid frame provided with corresponding recesses, whereby a separate cooling plate composed of a material having good thermal elimination is allocated to each of these printed circuit boards at that side of the printed circuit board carrying the components. In addition, a further printed circuit board that contacts all individual cooling plates in common and is traversed by coolant eliminates the heat supplied to the individual cooling plates of the printed circuit boards. The connection of the printed circuit boards to a wiring board attached to the grid frame at the back side is produced via press-on plug connectors that are situated at the back side of the printed circuit boards. Compared to previous systems wherein a plurality of flat modules were plugged perpendicularly side-by-side on a printed circuit board, this planar arrangement of flat modules has lead to a considerably higher density of the space-power relationship but allows a further enhancement only to a limited degree.

In order to enable a further enhancement of the packing density of LSI components, it has been proposed in German Patent Reference 0 428 859 to arrange a respective plurality of flat modules and cooling plates behind or, respectively, on top of one another in alternating sequence with their faces parallel to one another, so that they form a cuboid. The cooling plates are provided with cooling channels and clearances perpendicular thereto wherein resiliently fashioned pressure contacts are arranged for wiring the flat modules to one another. Plug boards having recesses for the acceptance of line plugs for feeding signals are provided at those surfaces of the two outer flat modules not equipped with components, whereby operating voltages are brought in at the other two sides of the cuboid and the coolant delivery and the coolant elimination for the cooling plates are brought in at the third side pairs. A three dimensional wiring within the function unit and, thus, an increased density of components per volume unit are thereby achieved.

SUMMARY OF THE INVENTION

It is an object of the present invention to provide a mounting system for electrical function units, particularly in the field of data technology, whereby the space-power ratio is further optimized over prior art structures.

For achieving this object, the mounting system is fashioned such that the terminal pads of the integrated components are brought directly into contact with the contact pads of the printed circuit boards via contact mats.

A highest component density is achieved as a result thereof since the integrated components (chips) can be arranged edge-against-edge. The quality of the microwiring of the printed circuit boards which *contact* the integrated components is also enhanced since no additional thermal stress arises due to soldering the components, the employment of the contact mats having made this soldering of the components superfluous. At the same time, changing components is also facilitated since no soldering work is now required.

In a further development, the present invention can be fashioned such that depressions up to the next metal level of the printed circuit board are provided between the contact pads of the printed circuit boards. Discrete wires for wiring changes can be laid in these depressions, such that the discrete wires can be connected to terminal locations etched free on this next metal level. These terminal locations are in turn connected to the contact pads at the printed circuit board surfaces via interlayer connections.

This yields the advantage that no additional space for discrete wiring is required and also allows the chips to be arranged edge-against-edge.

When the next metal level is connected to a zero voltage potential, a defined characteristic impedance can be produced given wiring changes.

It is also advantageous that the terminal pads for the integrated components and the terminal locations for the through-connections lie on the same level on the cooling plates. As a result a continuous contact mat for all terminals can be used.

When the integrated modules are rigidly secured on the cooling plates, then the cooling efficiency can be further enhanced since the shortest pads are produced from the heat source (chip) to the heat sink (cooling plate) that can contain water or liquid nitrogen as a coolant. The heat transmission from the integrated component to the cooling plate is optimized due to the direct mounting of the chip on the cooling plate.

Rapid interchangeability of the components is facilitated by the contact mat when the components are merely pressed against the cooling plate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures in which like reference numerals identify like elements, and in which:

DESCRIPTION OF THE PREFERRED EMBODIMENT

Figure 1:
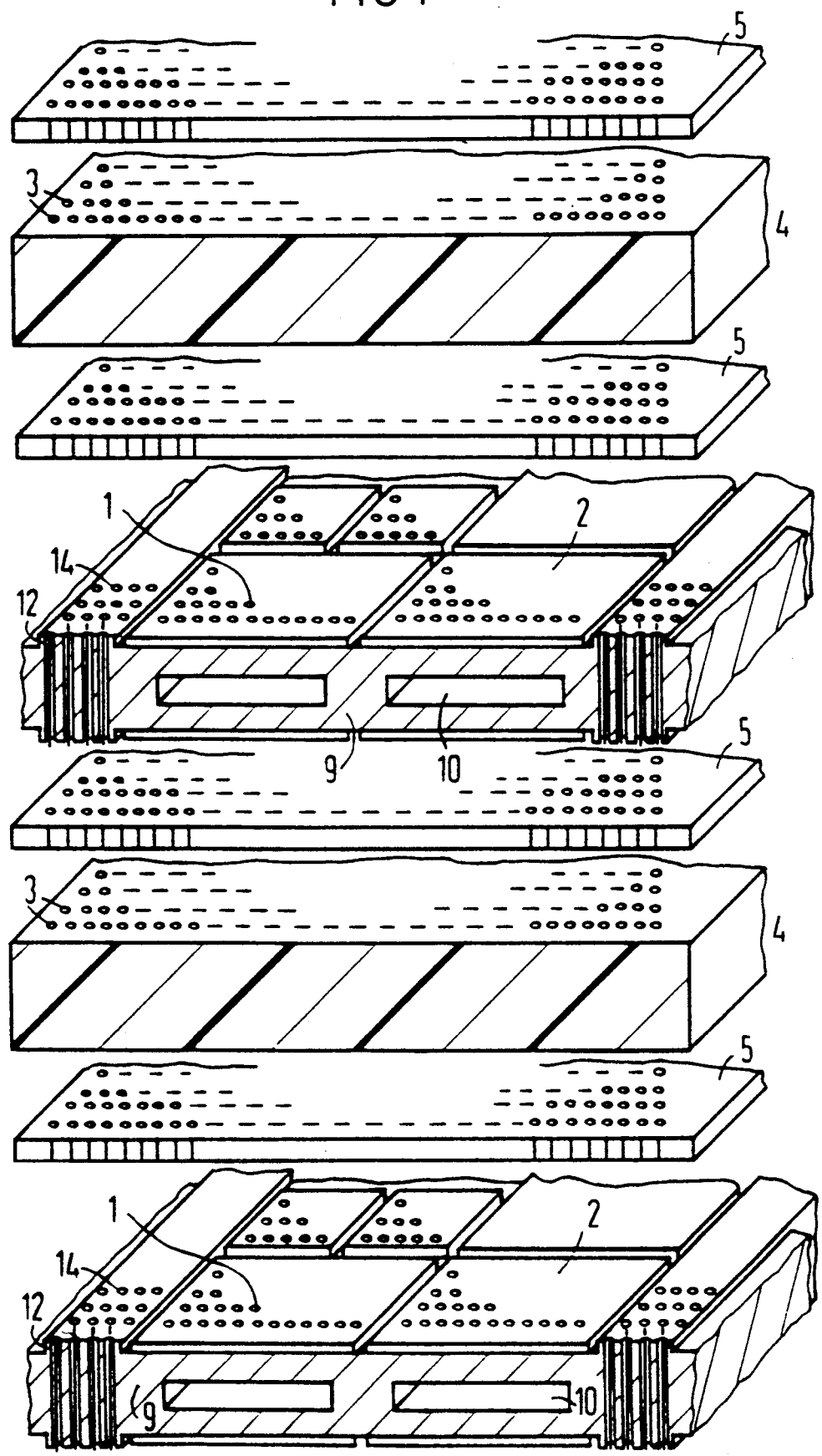
FIG. 1 is an exploded perspective view of a part of a function unit according to the present invention.

FIG. 1 shows a portion of a function unit. The integrated modules 2 have their side without contacts lying directly against the cooling plate 9 that is provided with cooling channels 10. These integrated modules 2 can be either rigidly joined to the cooling plate 9 (for example, by gluing or soldering) in order to achieve an extremely good heat transmission or can merely be pressed thereagainst, thereby providing for easy replacement of the integrated modules 2. The cooling plates are provided with through-connections 12 at their sides. Since both the contacts 14 for the through-connections 12 as well as the terminal contacts 1 of the integrated modules 2 lie on the same contact level, a simple contacting of the integrated components 2 lying on the cooling plate 9 at both sides is possible. The contacting of the integrated modules 2 with the printed circuit board 4, constructed with microwiring (referred to below as microwiring 4), with which the wiring of the integrated modules 2 to one another at respectively one side is undertaken occurs via the contact mat 5. Such contact mats 5 are known in the prior art. The sandwich-like structure of such a function unit can then be arbitrarily continued toward both sides, so that another contact mat 5 can be positioned on the upper side of the portion shown in FIG. 1 and is followed by a microwiring 4. A contact mat 5 then produces the contact to the next component level via the microwiring 4, whereby the components are again arranged on another cooling plate.

Figure 2:
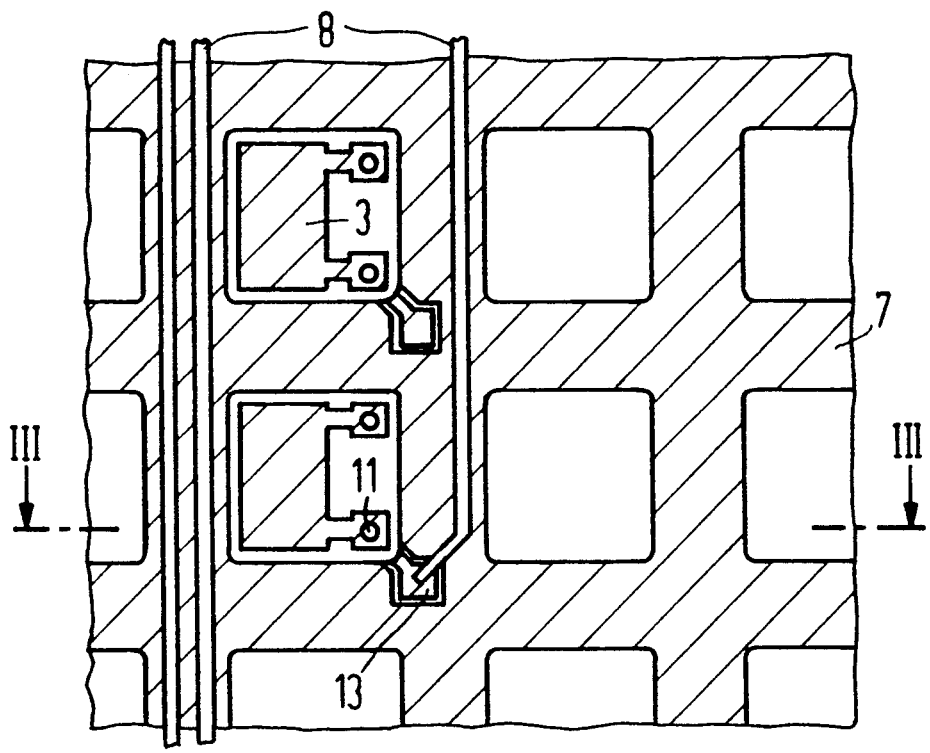
FIG. 2 is a plan view of the contact side of the microwiring.

FIG. 2 shows a plan view of the printed circuit board 4 with microwiring, the terminals thereof being composed of the contact areas 3 to which the terminals of the contact pads 1 of the modules 2 are connected via the contact mat 5 (not shown) lying thereabove. These contact areas 3 are formed by etching the surface of the printed circuit boards 4. Depressions 6 are etched, for example, with lasers, between these contact pads 3, these depressions 6 extending to the next-proximate metal layer 7. This metal layer 7 is at a zero voltage potential. The discrete wiring 8 on the zero voltage potential level is laid on this metal layer 7 between the component terminals in order to achieve a controlled characteristic impedance. The change wiring is contacted at this lower level at contact locations 13 that are etched free. The electrical connection of these contact locations 13 to the component terminal contact areas 3 occurs via the parallel interlayer connections 11.

Figure 3:
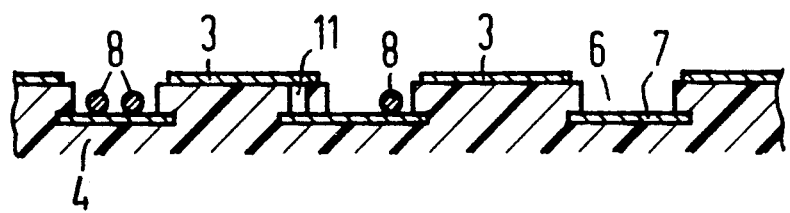
FIG. 3 is a section view III/III of FIG. 2.

A cross section is depicted in FIG. 3 and shows the contact areas 3 and the depression 6 that are provided for the discrete wiring 8. Also shown in FIG. 3 is the interlayer connections 11 and the zero voltage metal surface 7.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A mounting system for electrical function units, particularly for data technology, the mounting system, comprising:
   a plurality of cooling plates, each of the cooling plates having cooling channels for a coolant and having through-connections;
   integrated modules located on each cooling plate of the plurality of cooling plates, each of the integrated modules having terminal pads facing away from a respective cooling plate;
   contact mats pressing the integrated modules against the cooling plates;
   a plurality of printed circuit boards constructed in microwiring technology, each of the printed circuit boards having contact areas on first and second sides thereof, a respective contact mat having contact means directly connecting the terminal pads of a respective integrated module to the contact areas of one side of said first and second sides of a respective printed circuit board.

2. The mounting system for electrical function units according to claim 1, wherein the printed circuit boards have a first metal layer for the contact areas and wherein depressions down to a next metal layer of the printed circuit boards are provided between the contact areas of the printed circuit boards, the depressions containing discrete wires for wiring changes; wherein the discrete wires are connected to terminal locations etched free on the next metal layer, the terminal locations being in turn connected via interlayer connections to the contact areas on the printed circuit boards.

3. The mounting system for electrical function units according to claim 2, wherein the next metal layer is at a zero voltage potential.

4. The mounting system for electrical function units, according to claim 1, wherein the terminal pads for the integrated modules and the terminal locations for the through-connections on the cooling plates are at the same physical level.

5. The mounting system for electrical function units, according to claim 1, wherein the integrated modules are rigidly secured on the cooling plates.

6. The mounting system for electrical function units, according to claim 1, wherein the integrated modules are merely pressed against the cooling plates by the contact mats.

7. A mounting system for electrical function units, comprising:
   at least one cooling plate having cooling channels and having through-connections;
   at least one integrated module having a first side adjacent said cooling plate and having a second side provided with terminal pads;
   at least one printed circuit board constructed in microwiring technology having first and second sides each of which has contact areas;
   at least one contact mat having contact means directly connecting said terminal pads of said integrated module to said contact areas on one side of said first and second sides of said printed circuit board.

8. The mounting system for electrical function units according to claim 7, wherein the printed circuit board has a first metal layer for the contact areas and wherein depressions down to a next metal layer of the printed circuit board are provided between the contact areas of the printed circuit board, the depressions containing discrete wires for wiring changes; wherein the discrete wires are connected to terminal locations etched free on the next metal layer, the terminal locations being in turn connected via interlayer connections to the contact areas of the printed circuit board.

9. The mounting system for electrical function units according to claim 8, wherein the next metal level is at a zero voltage potential.

10. The mounting system for electrical function units, according to claim 7, wherein the terminal pads for the integrated module and terminal locations for the through-connections on the cooling plate are at the same level.

11. The mounting system for electrical function units, according to claim 7, wherein the integrated module is rigidly secured on the cooling plate.

12. The mounting system for electrical function units, according to claim 7, wherein the integrated module is merely pressed against the cooling plate by the contact mat.

13. A mounting system for electrical function units, comprising:
- a plurality of cooling plates, each of the cooling plates having cooling channels for a coolant and having through-connections;
- integrated modules located on each cooling plate of the plurality of cooling plates, each of the integrated modules having terminal pads facing away from a respective cooling plate;
- contact mats pressing the integrated modules against the cooling plates;
- a plurality of printed circuit boards constructed in microwiring technology, each of the printed circuit boards having contact areas on first and second sides thereof, a respective contact mat directly connecting the terminal pads of a respective integrated module to the contact areas of one side of said first and second sides of a respective printed circuit board; the printed circuit boards having a first metal layer with contact areas and having depressions down to a next metal layer of the printed circuit boards between the contact areas of the printed circuit boards, the depressions containing discrete wires for wiring changes, the discrete wires being connected to terminal locations etched free on the next metal layer and the terminal locations being in turn connected via interlayer connections to the contact areas on the printed circuit boards.

14. The mounting system for electrical function units according to claim 13, wherein the next metal layer as at a zero voltage potential.

15. The mounting system for electrical function units, according to claim 13, wherein the terminal pads for the integrated modules and the terminal locations for the through-connections on the cooling plates are at the same level.

16. The mounting system for electrical function units, according to claim 13, wherein the integrated modules are rigidly secured on the cooling plates.

17. The mounting system for electrical function units, according to claim 13, wherein the integrated modules are merely pressed against the cooling plates by the contact mats.

* * * * *